United States Patent
Rowenhorst et al.

(10) Patent No.: US 6,591,391 B1
(45) Date of Patent: Jul. 8, 2003

(54) METHOD OF GENERATING AN 8-VSB MODULATED SIGNAL

(75) Inventors: Bruce Rowenhorst, Cedar Rapids, IA (US); Jeffrey Briden, Sioux Falls, SD (US)

(73) Assignee: Sencore Inc., Sioux Falls, SD (US)

( * ) Notice: Subject to any disclaimer, the term of this patent is extended or adjusted under 35 U.S.C. 154(b) by 0 days.

(21) Appl. No.: 09/572,697

(22) Filed: May 16, 2000

Related U.S. Application Data

(60) Provisional application No. 60/152,739, filed on Sep. 8, 1999.

(51) Int. Cl.[7] ............................................. H03M 13/00
(52) U.S. Cl. ...................................... 714/756; 714/755
(58) Field of Search .............................. 348/495, 845.2; 714/752, 701, 756, 755, 762; 375/240.25, 321

(56) References Cited

U.S. PATENT DOCUMENTS

| | | | | |
|---|---|---|---|---|
| 5,602,595 A | * | 2/1997 | Citta et al. ................... | 348/495 |
| 5,831,690 A | * | 11/1998 | Lyons et al. ............. | 348/845.2 |
| 5,889,791 A | * | 3/1999 | Yang ........................... | 714/752 |
| 6,141,384 A | * | 10/2000 | Wittig et al. ........... | 375/240.25 |
| 6,353,900 B1 | * | 3/2002 | Sindhushayana et al. ... | 714/701 |
| 6,366,621 B1 | * | 4/2002 | Kuntz et al. ................ | 375/321 |

\* cited by examiner

*Primary Examiner*—David Ton
(74) *Attorney, Agent, or Firm*—Patnaude & Videbeck

(57) ABSTRACT

An 8-VSB modulated signal is produced using software to randomize, encode and interleave an MPEG II data signal and then converting the 2-bit encoded signals to 3-bit encoded signals using hardware.

3 Claims, 1 Drawing Sheet

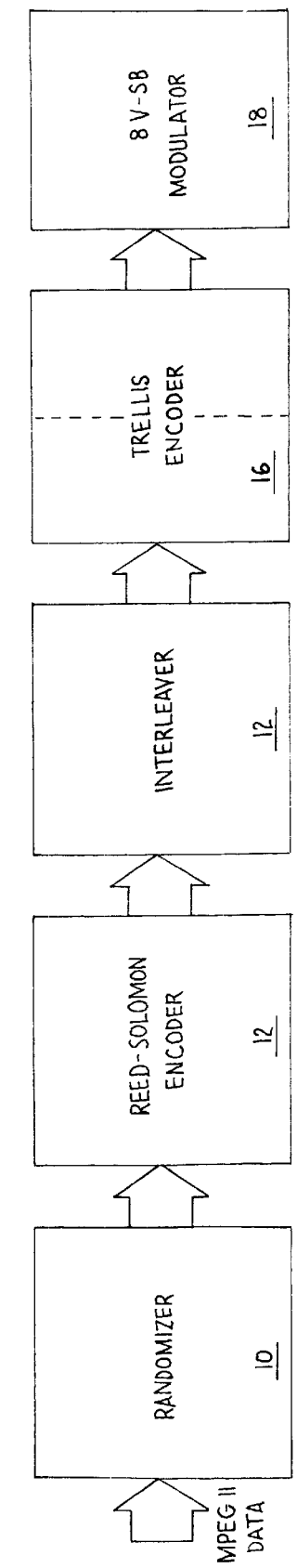
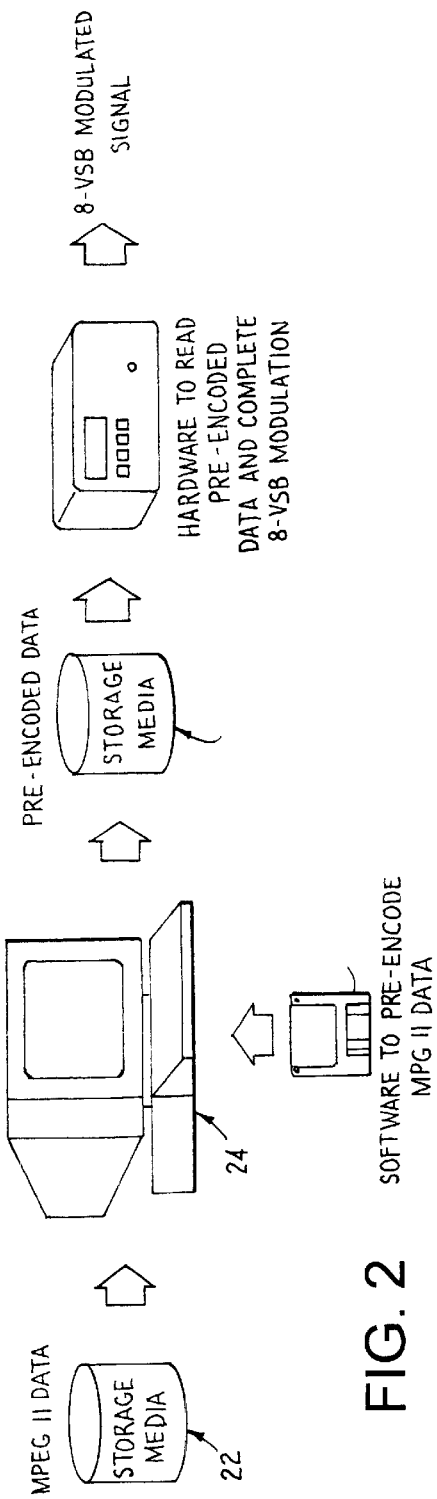

METHOD OF GENERATING AN 8-VSB MODULATED SIGNAL

The present invention generally relates to the generation of 8-VSB modulated signals for use in the High Definition Television which conform to the ATSC digital television standard, and it relates in particular to a new and improved method wherein the amount of hardware is reduced from that required in those 8-VSB modulated signal generators known in the prior art. The present application claims priority of provisional application Ser. No. 60/152,739 filed Sep. 8, 1999.

BACKGROUND OF THE INVENTION

A this time, broadcast television operates in accordance with a standard defined by NTSC (National Television Standards Committee). Over the next few years, the NTSC television standard is going to be phased out and replaced with a new standard to which present day HDTV conforms.

The HDTV standard for transmission uses a scheme called 8-VSB modulation as the means to convey MPEG II data (the video and audio information) from the transmitters to the receivers. The MPEG II video compression along with the 8-VSB modulation forms the transport layer for HDTV transmission. The original video information is thus processed prior to transmission, and this requires a considerable amount of processing to provide an acceptable degree of robustness in the system.

The receivers need all (100%) of the transmitted MPEG II data or unacceptable gaps in the audio and video will result. Since significant amounts of the transmitted data may be corrupted during transit from the transmitter to the receivers due to weather, power transients, etc., any lost data must be reconstructed by the receivers without retransmission of the original data by the transmitter. Such reconstruction is provided by the transport layer and requires a large amount of processing at the transmitter to keep pace with the data rate used by the HDTV system. Even though the operating speeds of silicon ICs are extremely fast and are increasing, the hardware presently required to encode the MPEG II data stream in real time is very expensive and not readily available.

SUMMARY OF THE INVENTION

Briefly, there is provided in accordance with the present invention a new and improved method of generating an 8-VSB signal which enables the use of software to replace much of the hardware now required to accomplish most of the processing of the MPEG II data before it is transmitted or stored in some suitable storage media. Once the MPEG II data has been stored in its pre-encoded or partially encoded form, a minimum amount of hardware can be used to retrieve the stored information and perform the final stage of 8-VSB modulation, which entails only a small amount of processing.

BRIEF DESCRIPTION OF THE DRAWING

The present invention may be better understood by a reading of the following detailed description taken in connection with the accompanying drawings wherein:

FIG. 1 is a block diagram of the 8-VSB encoding required by the a DSC standard now used in HDTV transmitters;

FIG. 2 is a pictorial illustrating possible uses of an 8-VSB modulated MPEG II signal produced by the method described herein; and

DETAILED DESCRIPTION OF A PREFERRED EMBODIMENT

HDTV uses an MPEG II data stream that contains all the video and audio information for one HDTV channel. The details of this system are beyond the scope of this invention. However, the video and audio data undergoes a series of transformations before transmission as shown in FIG. 1.

Referring to FIG. 1, the original MPEG II data is entered into a randomizer 10 which generates a pseudorandom number field which is processed with the MPEG II data by exclusive OR circuitry which spreads the energy in the subsequently transmitted signal evenly across the HDTV channel frequency range insuring that all parts of the signal will be equally immune to noise and thereby reducing the possibility of the HDTV signal interfering with an NTSC transmission.

The output of the randomizer 10 is applied to the input of a Reed-Solomon encoder 12 which uses an algorithm to add forward correction to the randomizer data from the randomizer 10. In the encoder 12, the randomizer MPEG II data stream is divided into packets of 188 bytes each including a packet sync byte. The Reed-Solomon encoder 12 processes the MPEG II packets through a conventional mathematical function which creates 20 bytes of correction information which is added to the end of each 188 byte packet. The 20 bytes of error correction can be used to correct up to 10 byte errors in the new 208 data segment at the receiving end without having to retransmit the corrupted data. If there are more than 10 byte errors in a single segment, the forward error correction will not be able to recover the lost information. The signal from the encoder 12 is fed to the input of an interleaver 14 which rearranges the data from the encoder to provide robustness against burst errors in the data stream. Selected data bytes in each incoming data segment are divided up and spread out or interleaved over many new segments. The interleaving process is reversed at the receiving end of the system. The necessary data bytes are selected from the many different segments and reassembled to form the original data segments as they were before transmission, i.e., they are de-interleaved. In this way if many sequential bytes have been lost during transmission, the de-interleaving process will spread the lost bytes out through many segments. The forward error correction can then recover the lost data.

A trellis encoder 16 is supplied with the output signal from the interleaver 14 and provides another form of forward correction wherein each 8-bit byte of-data is broken into four 2-bit words which are then put through another interleaving process the encoder 16 then creates a 3-bit code that describes the transition from the previous 2-bit word to the current 3-bit code thereby producing three bits of output for every two bits of data subsequently, a 1-byte sync signal is inserted at the first byte of each 208-segments forming a data field comprised of 313 segments.

The stream of data and sync signals from the interleaver 16 is applied to an 8-VSB encoder 18 which converts each of the 3-bit data words into one of eight voltage levels yielding the baseband 8-VSB modulated signal. Immediately following the 8-VSB modulation a small DC shift is applied to the baseband signal which has the effect of creating a residual carrier, or pilot, at the zero frequency point of the modulated signal.

The 8-VSB modulated and DC shifted signal is then AM modulated onto an IF carrier the resulting signal occupies more band width than is permissible under present day television standards, and therefore, this signal is subjected to a filtering process specially tailored to fit the 8-VSB modulated signal into the standard 6 MKz bandwidth allocated for one broadcast television television channel. Standard modulation techniques are then used to convert the signal to the desired channel.

The present invention provides a method of producing the heretofore described 8-VSB modulated signal which eliminates the need for most of the hardware previously required to do the high speed real time processing necessary for the encoding process this method uses software to do the randomizing, the Reed-Solomon encoding, the interleaving, and a first part of the trellis encoding instead of the hardware previously used for these purposes. This pre-encoded data is then saved.

The partially processed MPEG II signal is stored prior to the step of creating the 3-bit signal from the 2-bit signal. This later step in the usual process increases the amount of data by 50% but since it is not math intensive like the previous steps in the process it can be implemented in hardware.

Implementation of the method of the present invention may be seen to require a source of the MPEG II data, software to pre-encode the MPEG II data up to the point where the 2-bit signal is converted to a 3-bit signal, hardware to read the original MPEG II data and execute the software, and retrieve the partially processed data and complete the trellis encoding and 8-VSB modulation.

In one preferred use of the present invention as shown in FIG. 2, the above described method may be used at a retail store to demonstrate the operation of an HDTV television receiver when no HDTV signals are being broadcast by the local television stations. In such an application, any MPEG II signal suitable for such use is stored in a storage media 22 from which it is retrieved and processed by machine 24 using software from a floppy disk or other storage medium and applied to a storage media 28 in the partially encoded form. This partially encoded signal can then be used at any time desired by applying the pre-encoded data in the storage medium 28 to a piece of hardware 30 which completes the trellis encoding process to provide a complete 8-VSB modulated MPEG II signal for application to the input of the television receiver to be operated for demonstration purposes.

While the present invention has been described herein in connection with a preferred embodiment, it will be understood by those skilled in the art that many changes and modifications may be made without departing from the true spirit and scope of the invention.

What is claimed:

1. Apparatus for generating 8-VSB modulated signals for use in high definition television, comprising, randomizer means executed by software to which MPEG II data signals are adapted to be supplied for generating a pseudorandom number field and which spreads the energy tin its output signal evenly across an HDTV channel frequency range, first encoder means executed by software for dividing the processed MPEG II data from said randomizer means into 188 packets with each packet containing an additional sync byte packet and for creating a plurality of additional bytes of correction information which are added to the said 188 packets, interleaver means executed by software which mutually separates data bytes from said encoder means and interleaves said separated data bytes over a plurality of segments, second encoder means including a trellis encoder which breaks the 8-bit bytes of data from said interleaver into four 2-bit words and to convert said signal of 2-bit words into a 3-bit coded signal comprising a plurality of 3-bit data words, and an 8-VSB modulator for converting each 3-bit data word from the output of said second encoder means into one of eight voltage levels to provide a baseband 8-VSB modulated signal.

2. The apparatus according to claim 1, further comprising means for storing said MPEG II data signal, and said second encoder means includes portable means for storing signals partially encoded by said second encoder means, and hardware means for subsequently completing the encoding performed by said second encoder means prior to supplying the completely encoded MPEG II signal to said 8-VSB modulator.

3. A method of generating an 8-VSB modulated signal, comprising the steps of, storing an MPEG II data signal on a portable storage media, encoding said data signal utilizing software into a plurality of data packets and a plurality of bytes of error correction, interleaving said packets utilizing software to mutually rearrange said packets, partially encoding said signal comprising said interleaved packets wherein each 8-bit byte is converted into four 2-bit bytes, storing said signal of 2-bit byte interleaved packets in a storage media, then subsequently creating a 3-bit signal from the 2-bit signal utilizing hardware circuitry, providing an 8-VSB modulated MPEG II signal from said 3-bit signal, and then applying said 8-VSB modulated signal to the input of a television set for viewing said MPEG II data.

\* \* \* \* \*